United States Patent
Liu et al.

(10) Patent No.: US 12,033,911 B2
(45) Date of Patent: Jul. 9, 2024

(54) SEMICONDUCTOR STRUCTURE HAVING A GROOVE LOCATED IN THE SEMICONDUCTOR SUBSTRATE AND CONNECTED TO THE HEAT TRANSFER LAYER

(71) Applicant: CHANGXIN MEMORY TECHNOLOGIES, INC., Hefei (CN)

(72) Inventors: Jie Liu, Hefei (CN); Lixia Zhang, Hefei (CN); Zhan Ying, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 514 days.

(21) Appl. No.: 17/487,869

(22) Filed: Sep. 28, 2021

(65) Prior Publication Data
US 2022/0068751 A1  Mar. 3, 2022

Related U.S. Application Data

(63) Continuation of application No. PCT/CN2021/100218, filed on Jun. 15, 2021.

(30) Foreign Application Priority Data

Aug. 28, 2020  (CN) .......................... 202010887595.2

(51) Int. Cl.
*H01L 23/367*  (2006.01)
(52) U.S. Cl.
CPC .................................. *H01L 23/367* (2013.01)
(58) Field of Classification Search
CPC ........ H01L 23/367; H01L 23/38; H01L 23/40
USPC ........................................................ 438/276
See application file for complete search history.

(56) References Cited

U.S. PATENT DOCUMENTS

| 7,928,590 B2 | 4/2011 | Wolter |
| 2002/0038908 A1 | 4/2002 | Ding et al. |
| 2023/0178442 A1* | 6/2023 | Dou ........................ H01L 23/02 438/15 |

FOREIGN PATENT DOCUMENTS

| CN | 103560090 B | 6/2016 |
| CN | 106449562 A | 2/2017 |
| CN | 104103527 B | 10/2017 |
| CN | 108711561 A | 10/2018 |
| CN | 107768325 B | 10/2019 |
| CN | 111128976 A | 5/2020 |
| CN | 111354691 A | 6/2020 |
| CN | 211208432 U | 8/2020 |

OTHER PUBLICATIONS

Written Opinion cited in PCT/CN2021/100218, mailed on Sep. 13, 2021, 6 pages.
International Search Report as cited in PCT Application No. PCT/CN2021/100218 mailed Sep. 13, 2021, 4 pages.

* cited by examiner

*Primary Examiner* — Hoai V Pham
(74) *Attorney, Agent, or Firm* — Kilpatrick Townsend & Stockton LLP

(57) ABSTRACT

Embodiments of the present application provide a semiconductor structure that comprises a semiconductor substrate having a first surface and a second surface opposite to the first surface, a solder pad located at the first surface, a heat transfer layer located at the first surface and being in contact with the solder pad, and a groove located in the semiconductor substrate and being connected to the heat transfer layer.

20 Claims, 2 Drawing Sheets

250

SEMICONDUCTOR STRUCTURE HAVING A GROOVE LOCATED IN THE SEMICONDUCTOR SUBSTRATE AND CONNECTED TO THE HEAT TRANSFER LAYER

CROSS-REFERENCE TO RELATED APPLICATIONS

The present application is a continuation of International Patent Application No. PCT/CN2021/100218, filed on Jun. 15, 2021, which claims priority to Chinese Patent Application No. 202010887595.2, filed on Aug. 28, 2020, entitled "Semiconductor Structure". The entire contents International Patent Application No. PCT/CN2021/100218 and Chinese Patent Application No. 202010887595.2 are herein incorporated by reference.

TECHNICAL FIELD

Embodiments of the present application relate to the technical field of integrated circuit packaging, and more particularly to a semiconductor structure.

BACKGROUND

With continued improvement and development of integrated circuits, the dimension thereof is constantly reduced, and the function thereof is constantly enhanced. However, while the function is enhanced, increasingly more chips are required for an integrated circuit, and the integration level of semiconductor packaging is gradually strengthened, heat dissipation management of semiconductors hence becomes a very important design focus during the process of packaging integrated circuits and semiconductors. Since the chips are embedded inside organic materials with inferior heat dissipation capability, heat cannot be quickly dissipated, and this might cause performance declination of the system or even total failure of the system.

Heat dissipation capability is of particular importance in stacked-style packaged semiconductor structures. Since none of currently available heat dissipation techniques could effectively transmit or dissipate heat of solder pads, the peak temperature is unduly high in parts of the semiconductor package structure, and such overheat adversely affects the reliability of the entire semiconductor package structure.

SUMMARY

In view of the foregoing problems, embodiments of the present application provide a semiconductor structure to solve the problems of inferior heat dissipation capability of semiconductor structures and unduly high temperature at parts of solder pads in semiconductor structures.

According to the first aspect of the embodiments of the present application, there is provided a semiconductor structure that comprises a semiconductor substrate having a first surface and a second surface opposite to the first surface, a solder pad located at the first surface, a heat transfer layer located at the first surface and being in contact with the solder pad, and a groove located in the semiconductor substrate and being connected to the heat transfer layer.

According to the second aspect of the embodiments of the present application, there is further provided a semiconductor package structure that is characterized in comprising plural semiconductor structures, as recited above, sequentially stacked one on another.

The semiconductor substrate includes a solder pad, a heat transfer layer and a groove, the solder pad is in contact with the heat transfer layer, and the groove is connected to the heat transfer layer, so the heat on the solder pad can be transferred through the heat transfer layer into the groove, and this helps prevent heat accumulated in the solder pad from causing unduly high peak temperature in parts of the semiconductor structure, thereby prevents performance declination or even total system failure of the semiconductor structure, and hence solves the problems of inferior heat dissipation capability of the semiconductor structure and unduly high temperature at parts of the solder pad in the semiconductor structure.

DESCRIPTION OF EMBODIMENTS

As can be known from the Background of the Related Art, heat dissipation performance of prior-art semiconductor structures is to be improved.

In the state of the art, it is common to attach a cold plate and a heat sink onto the backside of the package structure for heat dissipation of the semiconductor structure, whereby heat is transferred to system environmental control or to the atmosphere, but such heat dissipation structure is not in direct contact with the chips, as there are package base plate and housing sandwiched there between; since the package base plate is low in heat conductivity, and thermal resistance is great at the interlaminar interface, heat cannot be timely and highly efficiently transferred out, whereby the package structure as a whole is rendered inferior in heat dissipation efficiency, and reliability of the package structure is hence deteriorated. Additionally, dummy connectors are further disposed in prior-art wafers, but none of the various currently available heat dissipation techniques could effectively transfer or dissipate heat from the solder pads, this makes the peak temperature unduly high in parts of the semiconductor structure, and such overheat would adversely affect the reliability of the semiconductor structure as a whole.

In order to address the above problems, embodiments of the present application provide a semiconductor structure to solve the problems of inferior heat dissipation capability of semiconductor structures and unduly high temperature at parts of solder pads in semiconductor structures.

To make more clear the objectives, technical solutions and advantages of the present application, embodiments of the present application will be enunciated in greater detail below with reference to the accompanying drawings. As can be understood by persons ordinarily skilled in the art, many technical details are proposed in the various embodiments of the present application for readers to better understand the present application. However, the technical solutions claimed for protection by the present application can still be realized even without these technical details and various modifications and amendments makeable on the basis of the following embodiments.

Figure 1:
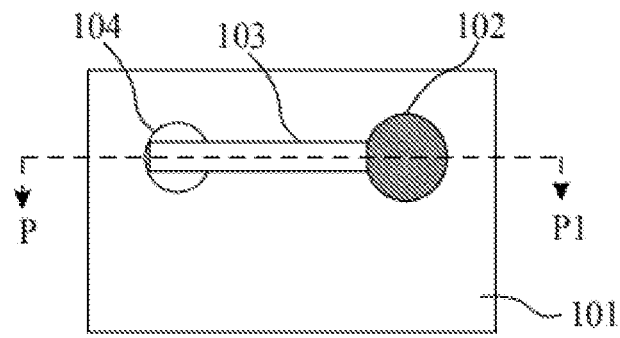
FIG. 1 is a vertical view schematically illustrating the structure of the semiconductor substrate of a semiconductor structure provided by an embodiment of the present application.
Figure 2:
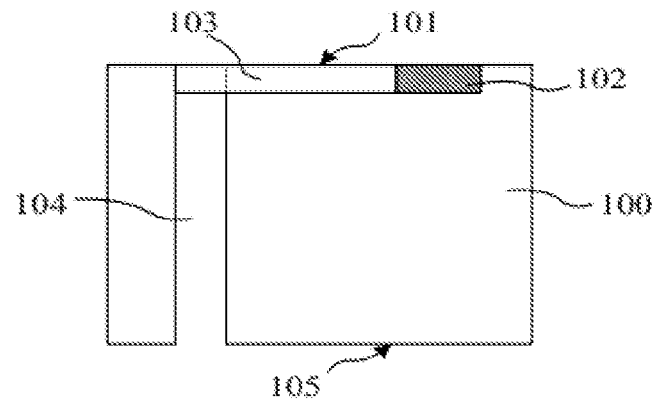
FIG. 2 is a cross-sectional view schematically illustrating the structure cut along line P-P1 in FIG. 1.
Figure 3:
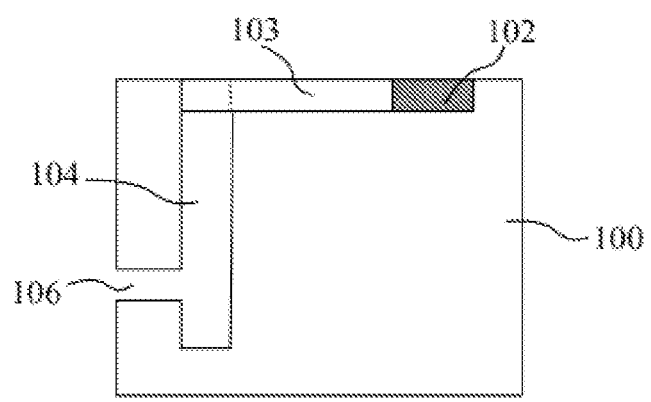
FIG. 3 is another cross-sectional view schematically illustrating the structure cut along line P-P1 in FIG. 1.
Figure 4:
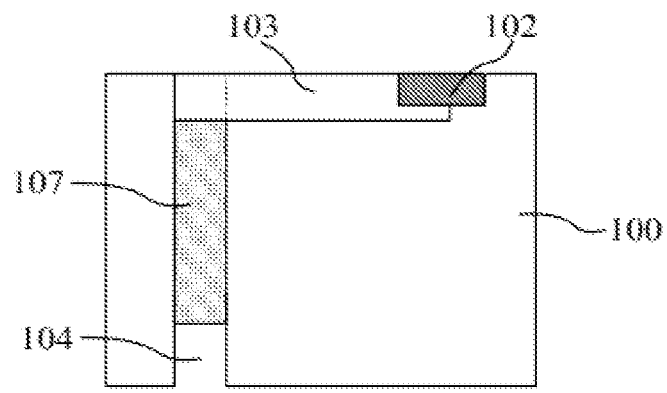
FIG. 4 is yet another cross-sectional view schematically illustrating the structure cut along line P-P1 in FIG. 1.
Figure 5:
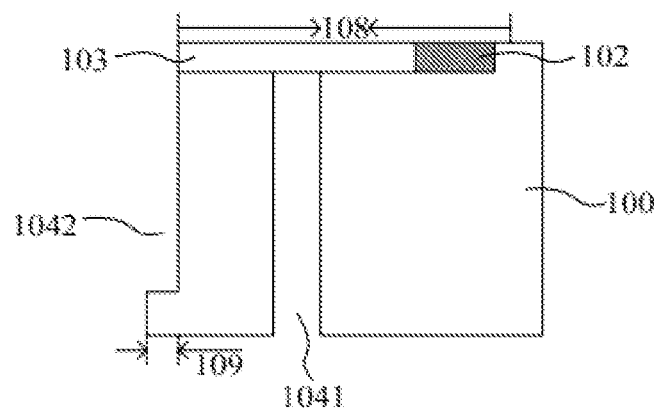
FIG. 5 is still another cross-sectional view schematically illustrating the structure cut along line P-P1 in FIG. 1.

FIG. 1 is a vertical view schematically illustrating the structure of the semiconductor substrate of a semiconductor structure provided by an embodiment of the present application; FIG. 2 is a cross-sectional view schematically illustrating the structure cut along line P-P1 in FIG. 1; FIG. 3 is another cross-sectional view schematically illustrating the structure cut along line P-P1 in FIG. 1; FIG. 4 is yet another cross-sectional view schematically illustrating the structure cut along line P-P1 in FIG. 1; and FIG. 5 is still another cross-sectional view schematically illustrating the structure cut along line P-P1 in FIG. 1.

Referring to FIGS. 1 and 2, the semiconductor structure in the first embodiment of the present application comprises a semiconductor substrate 100 having a first surface 101 and a second surface 105 opposite to the first surface 101, a solder pad 102 located at the first surface 101, a heat transfer layer 103 located at the first surface 101 and being in contact with the solder pad 102, and a groove 104 located in the semiconductor substrate 100 and being connected to the heat transfer layer 103.

The semiconductor structure provided by the first embodiment of the present application will be described in detail below with reference to the accompanying drawings.

The semiconductor substrate 100 is a wafer or a chip.

As shown in FIG. 2, in the embodiment of the present application, the semiconductor substrate 100 includes a groove 104 located at a first surface 101, a heat transfer layer 103 and a solder pad 102, of which the groove 104 is connected to the heat transfer layer 103, and the heat transfer layer 103 is in contact with the solder pad 102. In other embodiments, the semiconductor substrate further includes an insulating layer that covers the first surface of the semiconductor substrate, and the heat transfer layer and the solder pad are located at the first surface of the insulating layer.

Thusly, heat on the solder pad 102 can be transferred through the heat transfer layer 103 into the groove 104, and this prevents the heat accumulated in the solder pad 102 from causing temperature peaks at parts of the semiconductor structure, hence avoids abrupt rising of temperature in the space of the semiconductor structure, avoids the problems of signal interference due to abrupt rising of temperature, system performance declination or even total failure, and solves the problems of inferior heat dissipation capability of the semiconductor structure and unduly high temperature at parts of the solder pad 102 in the semiconductor structure.

The groove 104 is located in the semiconductor substrate 100. Specifically, as shown in FIG. 2, in the embodiment of the present application, the groove 104 passes through the semiconductor substrate 100 along a direction perpendicular to the semiconductor substrate 100.

The groove 104 can have an aspect ratio of 20:1 to 100:1; specifically, the aspect ratio of the groove 104 can be 40:1, 60:1 or 80:1.

The groove 104 can have a width of 2 μm-10 μm; specifically, the width of the groove 104 can be 4 μm, 6 μm or 8 μm.

In another example, as shown in FIG. 3, the groove 104 can be a blind via located in the semiconductor substrate 100. When the groove 104 is a blind via located in the semiconductor substrate 100, the semiconductor structure further comprises a communicating hole 106; the communicating hole 106 is located in the semiconductor substrate 100, an extension direction of the communicating hole 106 is different from an extension direction of the groove 104, on the semiconductor substrate 100 is exposed one end of the communicating hole 106, and another end of the communicating hole 106 is connected to the groove 104.

As can be understood, the groove 104 in the semiconductor substrate 100 can be a through hole passing through the semiconductor substrate 100, or a blind via in the semiconductor substrate 100. When the groove 104 is a blind via in the semiconductor substrate 100, the groove 104 will be connected to the communicating hole 106 whose one end is exposed outside the semiconductor substrate 100.

It is thus guaranteed that each groove 104 in the semiconductor substrate 100 should be connected to system environmental control or atmosphere, whereby it is possible to quickly transfer the heat in the groove 104 out of the semiconductor structure, to enhance the reliability of the semiconductor structure, and to solve the problems of inferior heat dissipation capability of the semiconductor structure and unduly high temperature at parts of the solder pad 102 in the semiconductor structure.

As shown in FIG. 4, in another example, the semiconductor structure further comprises a thermally conductive layer 107 that is located in the groove 104, and whose volume is smaller than the cubage of the groove 104. As can be understood, the thermally conductive layer 107 can be of a metal material.

In the embodiment of the present application, in the groove 104 is disposed a thermally conductive layer 107 whose volume is smaller than the cubage of the groove 104, the thermally conductive layer 107 strengthens the capability of the groove 104 to absorb heat, can dissipate heat on the solder pad 102 as quickly as possible, prevents signals from being interfered, enhances the reliability of the semiconductor structure, and solves the problems of inferior heat dissipation capability of the semiconductor structure and unduly high temperature at parts of the solder pad 102 in the semiconductor structure. The volume of the thermally conductive layer 107 is set to be smaller than the cubage of the groove 104, whereby is avoided that heat expansion and cold contraction of the thermally conductive layer 107 after its having been heated should have the groove 104 pressed against.

As shown in FIG. 5, one semiconductor substrate 100 may include plural grooves 104 (refer also to FIG. 4), for instance, a first groove 1041 and a second groove 1042. Understandably, plural grooves 104 can enhance the heat dissipation rate of the solder pad 102, and thus enhance the reliability of the semiconductor structure.

In the embodiment of the present application, as shown in FIG. 3, one heat transfer layer 103 is connected to one groove 104. In another example, as shown in FIG. 5, the same and single heat transfer layer 103 is connected to plural grooves 104 (the first groove 1041 and the second groove 1042). Plural grooves 104 can enhance the heat dissipation rate of the heat transfer layer 103, and thus enhance the reliability of the semiconductor structure.

In the embodiment of the present application, the heat transfer layer 103 is connected to the groove 104 in such a manner that the heat transfer layer 103 covers one end of the groove 104. In another example, as shown in FIG. 5, the sidewall of the heat transfer layer 103 is flush with the sidewall of the groove 104, and the heat transfer layer 103 covers one end of the groove 104. Understandably, it is also possible for the heat transfer layer 103 to only cover one end of the groove 104 or cover partial end surface of the groove 104. The larger the area communicating the heat transfer layer 103 and the groove 104 is, the better will be the heat conduction effect.

The heat transfer layer 103 is of an insulating material, and the material includes a thermally conductive silica gel, a thermally conductive insulating elastomer, or a thermally conductive filling glue.

Of these, the thermally conductive filling glue possesses high heat conductivity and electrical insulation property, can be vulcanized and coagulated under room temperature, serves gluing, sealing and shaping functions, can quickly transfer heat of an exothermic body out and cool the exothermic body at the same time, all with excellent heat conduction effect.

The thermally conductive insulating elastomer is of a silicon rubber base material, and makes use as filler of such ceramic particles as boron nitride, alumina etc. It has a heat conduction effect more excellent than that of the thermally conductive silica gel, and its thermal impedance is less than other thermally conductive materials under equivalent conditions.

Being the most widely used thermally conductive material, the thermally conductive silica gel includes thermally conductive silicone grease, thermally conductive silicone tape, thermally conductive silicon tape, etc.

In the embodiment of the present application, as shown in FIG. 3, the heat transfer layer 103 is in contact with a side of the solder pad 102. In another example, the heat transfer layer 103 is in contact with a bottom surface of the solder pad 102 facing towards the second surface 105. Understandably, as shown in FIG. 4, the heat transfer layer 103 can be in contact simultaneously with a side of the solder pad 102 and a bottom surface thereof facing towards the second surface 105. The larger the area of contact between the heat transfer layer 103 and the solder pad 102 is, the better will be the heat conduction effect.

In the semiconductor structure provided by the first embodiment of the present application, the heat on the solder pad 102 can be transferred through the heat transfer layer 103 into the groove 104, and the groove 104 then forwards the heat to system environmental control or to the atmosphere, whereby is solved the problem in the currently available semiconductor structure in which, when a large-current signal is conducted through the solder pad 102, more heat is accumulated at the solder pad 102 and there is a high demand to dissipate heat there, but since the base plate is low in heat conductivity and thermal resistance is great at the multi-layered interface, the heat cannot be timely and highly effectively transferred out, thereby causing adverse effect as inferior heat dissipation capability of the semiconductor structure; the aforementioned advantage also prevents the heat accumulated in the solder pad 102 from causing temperature peaks at parts of the semiconductor structure, hence avoids abrupt rising of temperature in the space of the semiconductor structure to cause system performance declination or even total failure, and solves the problems of inferior heat dissipation capability of the semiconductor structure and unduly high temperature at parts of the solder pad 102 in the semiconductor structure.

Referring to FIG. 5, the second embodiment of the present application further provides a semiconductor structure, which is essentially the same as that in the first embodiment, and differs from the latter mainly as follows. The semiconductor substrate 100 includes a central region 108 and a peripheral region 109 surrounding the central region 108, and the grooves 104 include a first groove 1041 located at the central region 108 and a second groove 1042 located at the peripheral region 109. The semiconductor structure provided by the second embodiment of the present application will be described in detail below with reference to the accompanying drawings. See the description to the first embodiment for portions identical with or corresponding to the first embodiment, while no repetition will be made in this context.

As shown in FIG. 5, in the semiconductor structure provided by the second embodiment of the present application, the semiconductor substrate 100 includes a central region 108 and a peripheral region 109 surrounding the central region 108, and the grooves 104 include a first groove 1041 located at the central region 108 and a second groove 1042 located at the peripheral region 109, of which the first groove 1041 passes through the semiconductor substrate 100, and the second groove 1042 is a blind via located in the semiconductor substrate 100.

In summary, as can be understood, the groove 104 can passing through the semiconductor substrate 100, alternatively, the groove 104 can be a blind via located in the semiconductor substrate 100; if the groove 104 is a blind via located in the semiconductor substrate 100, such a groove 104 is disposed at the peripheral region 109 of the semiconductor substrate 100, thusly, after the heat of the solder pad 102 is transferred through the heat transfer layer 103 into the groove 104, different grooves 104 can all be connected to system environmental control or exposed to the atmosphere to forward the heat of the solder pad 102 to system environmental control or to the atmosphere.

In comparison with the first embodiment of the present application, the semiconductor structure in this embodiment enables each groove 104 to be connected to system environmental control or the atmosphere without the presence of the communicating hole 106 (refer to FIG. 3), ensures quick conduction of heat in the groove 104 out of the semiconductor structure without increasing the complexity of the semiconductor structure, prevents heat from accumulating in the semiconductor structure, enhances the reliability of the semiconductor structure, and solves the problems of inferior heat dissipation capability of the semiconductor structure and unduly high temperature at parts of the solder pad 102 in the semiconductor structure.

Figure 6:
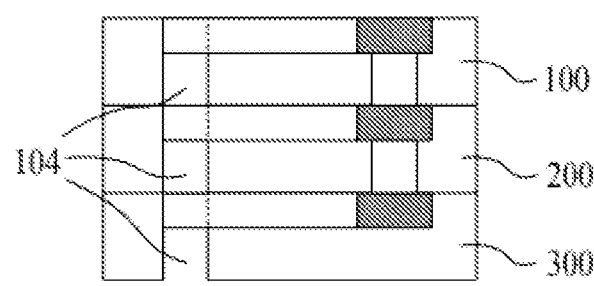
FIG. 6 is a cross-sectional view schematically illustrating the structure of a semiconductor package structure provided by an embodiment of the present application.

FIG. 6 is a cross-sectional view schematically illustrating the structure of a semiconductor package structure provided by an embodiment of the present application.

The third embodiment of the present application further provides a semiconductor package structure that comprises plural aforementioned semiconductor structures stacked one on another. As shown in FIG. 6, the semiconductor package structure comprises a semiconductor substrate 100, a second semiconductor substrate 200 and a third semiconductor substrate 300, and plural grooves 104 of the plural semiconductor structures are connected to one another. Plural grooves 104 of the plural semiconductor structures are connected to one another to form one groove 104, and this reduces complexity of the semiconductor package structure and facilitates implementation.

As shown in FIG. 6, the plural communicative grooves 104 can be communicated to the outer surface of the semiconductor package structure. The plural communicative grooves 104 are communicated to the outer surface of the semiconductor package structure to uniformly transfer heat of the solder pad 102 in the semiconductor package structure to system environmental control or to the atmosphere, whereby complexity of the semiconductor package structure is reduced. Understandably, grooves 104 of plural semiconductor structures can also be set independent of one another, to be singly connected to system environmental control or to the atmosphere.

In one example, the plural semiconductor structures in the semiconductor package structure include a first semiconductor structure and a second semiconductor structure, the second semiconductor structure further includes a solder pad 102 located at a second surface 105 of the second semiconductor structure, and a solder pad 102 at a first surface 101 of the first semiconductor structure is connected with the solder pad 102 at the second surface 105 of the second semiconductor structure.

The semiconductor package structure provided by the third embodiment of the present application comprises plural semiconductor structures stacked one on another, the heat of solder pads 102 of the plural semiconductor structures is transferred through heat transfer layers 103 into mutually communicative grooves 104, and is then uniformly forwarded to system environmental control or to the atmosphere, whereby are solved the problems of inferior heat dissipation capability of the semiconductor package structure and unduly high temperature at parts of the solder pads 102 in the semiconductor package structure, at the same time of reducing complexity of the semiconductor package structure.

In the semiconductor structure and semiconductor package structure provided by the embodiments of the present application, the heat transfer layer 103 comes into contact with the solder pad 102 and the groove 104 to transfer heat in the solder pad 102 into the groove 104, and the groove 104 then forwards the heat to system environmental control or to the atmosphere, whereby is solved the problem in the semiconductor structure and the semiconductor package structure in which, when a large-current signal is conducted through the solder pad 102, more heat is accumulated at the solder pad 102 and there is a high demand to dissipate heat there, but since the base plate is low in heat conductivity and thermal resistance is great at the multi-layered interface, the heat cannot be timely and highly effectively transferred out, thereby causing adverse effect as inferior heat dissipation capability of the semiconductor structure; the aforementioned advantage also prevents the heat accumulated in the solder pad 102 from causing temperature peaks at parts of the semiconductor structure, hence avoids abrupt rising of temperature in the space of the semiconductor package structure to cause system performance declination or even total failure, and solves the problems of inferior heat dissipation capability of the semiconductor package structure and unduly high temperature at parts of the solder pad 102 in the semiconductor structure.

As comprehensible to persons ordinarily skilled in the art, the aforementioned embodiments are specific examples to realize the present application, while in actual application it is possible to make various modifications thereto both in form and in detail without departing from the spirit and scope of the present application. Any person skilled in the art may make various modifications and amendments without departing from the spirit and scope of the present application, so the protection scope of the present application shall be based on the scope as defined in the attached Claims.

What is claimed is:
1. A semiconductor structure, comprising:
   a semiconductor substrate, having a first surface and a second surface opposite to the first surface;
   a solder pad, located at the first surface;
   a heat transfer layer, located at the first surface and being in contact with the solder pad; and
   a groove, located in the semiconductor substrate and being connected to the heat transfer layer.

2. The semiconductor structure according to claim 1, wherein the groove passes through the semiconductor substrate along a direction perpendicular to the semiconductor substrate, alternatively, that the groove is a blind via located in the semiconductor substrate.

3. The semiconductor structure according to claim 2, wherein the groove is a blind via located in the semiconductor substrate, and that the semiconductor structure further comprises a communicating hole located in the semiconductor substrate, wherein an extension direction of the communicating hole is different from an extension direction of the groove, on the semiconductor substrate is exposed one end of the communicating hole, and another end of the communicating hole is connected to the groove.

4. The semiconductor structure according to claim 1, wherein the groove has an aspect ratio of 20:1-100:1.

5. The semiconductor structure according to claim 4, wherein the groove has a width of 2 μm-10 μm.

6. The semiconductor structure according to claim 1, wherein the heat transfer layer is in contact with a side of the solder pad.

7. The semiconductor structure according to claim 1, wherein the heat transfer layer is in contact with a bottom surface of the solder pad facing towards the second surface.

8. The semiconductor structure according to claim 1, wherein the heat transfer layer is in contact simultaneously with a side of the solder pad and a bottom surface of the solder pad facing towards the second surface.

9. The semiconductor structure according to claim 1, wherein the heat transfer layer is of an insulating material.

10. The semiconductor structure according to claim 9, wherein a material of the heat transfer layer includes a thermally conductive silica gel, a thermally conductive insulating elastomer, or a thermally conductive filling glue.

11. The semiconductor structure according to claim 1, wherein the heat transfer layer covers one end of the groove.

12. The semiconductor structure according to claim 1, wherein the heat transfer layer covers partial end surface of the groove.

13. The semiconductor structure according to claim 1, wherein there are plural grooves, and that the same and single heat transfer layer is connected to the plural grooves.

14. The semiconductor structure according to claim 1, wherein further comprising a thermally conductive layer that is located in the groove, and whose volume is smaller than a cubage of the groove.

15. The semiconductor structure according to claim 14, wherein the thermally conductive layer is of a metal material.

16. The semiconductor structure according to claim 1, wherein the semiconductor substrate further includes an insulating layer, wherein the insulating layer covers the first surface of the semiconductor substrate, and the heat transfer layer and the solder pad are located at the first surface of the insulating layer.

17. The semiconductor structure according to claim 1, wherein the semiconductor substrate includes a central region and a peripheral region surrounding the central region, and that the grooves include a first groove located at the central region, and a second groove located at the peripheral region, of which the first groove passes through the semiconductor substrate, and the second groove is a blind via located in the semiconductor substrate.

18. A semiconductor package structure, comprising plural semiconductor structures as recited in claim 1 sequentially stacked one on another.

19. The semiconductor package structure according to claim 18, wherein plural grooves of the plural semiconductor structures are connected to one another.

20. The semiconductor package structure according to claim 18, wherein the plural semiconductor structures include a first semiconductor structure and a second semiconductor structure, wherein the second semiconductor structure further includes a solder pad located at a second surface of the second semiconductor structure, and a solder pad at a first surface of the first semiconductor structure is connected with the solder pad at the second surface of the second semiconductor structure.

* * * * *